United States Patent [19]

Doriath et al.

[11] Patent Number: 4,697,145
[45] Date of Patent: Sep. 29, 1987

[54] MEASURING SYSTEM AND MEASURING CELL FOR MAKING MAGNETIC FIELD MEASUREMENTS

[75] Inventors: Gérard Doriath, Palaiseau; Pierre Hartemann, Paris; Alain Jacobelli, St. Michel sur Orge, all of France

[73] Assignee: Thomson-CSF, Paris, France

[21] Appl. No.: 694,275

[22] Filed: Jan. 24, 1985

[30] Foreign Application Priority Data

Jan. 27, 1984 [FR] France .................. 84 01289

[51] Int. Cl.$^4$ .............. G01R 33/02; G02B 5/30; G02F 1/29; G02F 1/31
[52] U.S. Cl. .................... 324/244; 350/375
[58] Field of Search .............. 324/244, 262; 350/375-378

[56] References Cited

FOREIGN PATENT DOCUMENTS 0081412 6/1963 European Pat. Off. .
2198146 3/1974 France .

Primary Examiner—Reinhard J. Eisenzopf
Assistant Examiner—Walter E. Snow
Attorney, Agent, or Firm—Oblon, Fisher, Spivak, McClelland, & Maier

[57] ABSTRACT

A process and apparatus for measuring a magnetic field based on the Faraday effect rotation of a light beam passing through a ferrimagnetic coating subject to a magnetic field to be measured is shown. The magnetization direction within the ferrimagnetic coating is coherently oriented by applying a high amplitude alternating magnetic field oriented in accordance with the axis of the light beam. This is followed by a progressive reduction of the amplitude of this magnetic field and the magnetic field to be measured is compensated. A system and a measuring cell making it possible to perform said process is also shown.

4 Claims, 3 Drawing Figures

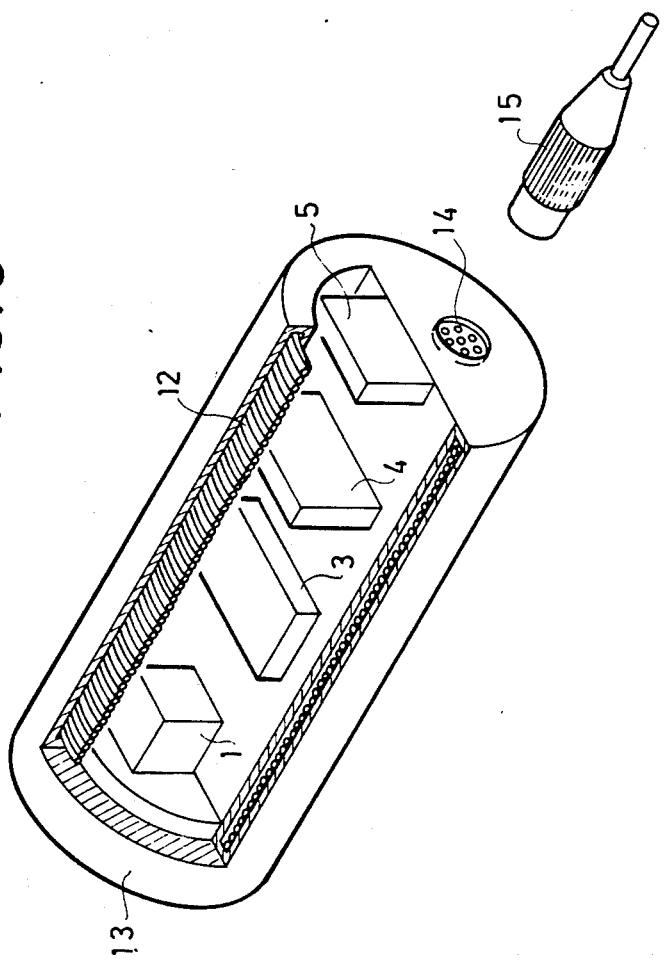

MEASURING SYSTEM AND MEASURING CELL FOR MAKING MAGNETIC FIELD MEASUREMENTS

BACKGROUND OF THE INVENTION

The invention relates to a process for the magnetooptical measurement of magnetic fields. It also relates to a system performing this process and to a measuring cell adapted to said system.

It is known to accurately measure the value of a magnetic field at a given point. This accuracy requirement leads to the design of equipment having a sensitivity such that their measurements can be affected by fluctuations of the ambient magnetic field. Thus, for example, certain magnetometers make it possible to measure weak magnetic fields of approximately 1 nano-Tesla, while convetionally the ambient magnetic field has variation amplitudes ranging between a few dozen to a few hundred nano-Tesla in a frequency spectrum extending from continuous field to a alternating field having a frequency of few dozen Hertz.

For carrying out precise magnetic field measurements and in order to be able to correct them as a function of the ambient magnetic field, it is possible to use several magnetometers. Precautions must then be taken to ensure that the magnetometers do not impact the measurements of one act one another.

French Patent application No. 2,471,608, published on 13.8.1982, its first addition 2,517,831 published on 10.6.1983 and French Patent application No. 8,311,073 filed on 4.7.1983 describe magnetometers, whose common basic cell is constituted by a polarized light source, a thin film having a significant magnetooptical effect, an analyzer and an electric current-light conversion and detection system. To these elements are added a feedback and modulation solenoid, as well as a pair of saturation magnets or coils producing a polarizing magnetic field.

When several magnetometers are used in a reduced volume, which is the case for triaxial measurements, or when the basic cells are used for measuring magnetic field gradient vectors, the sensitivity of the measurement is effected by the existence of continuous polarizing magnetic fields, which mutually deform the magnetic field lines. Attempts have been made to reduce or eliminate these continuous polarizing magnetic fields.

The invention provides a solution making it possible to eliminate the polarizing magnetic field of the magnetometer. It also has the advantage of operating with a magnetometer probe of simplified design and reduced overall dimensions.

BRIEF SUMMARY OF THE INVENTION

The present invention therefore relates to a process for measuring the magnetic field using a coating of a ferrimagnetic material into which is passed, in accordance with a given axis, a light beam polarized in accordance with a given plane, in such a way that a magnetic field oriented in accordance with the axis of the beam has by way of a Faraday effect the rotation of the light polarizing plane, wherein it comprises a first induction stage in the ferrimagnetic material coating, along the axis of the light beam, of an alternating modulation magnetic field, whose amplitude exceeds the saturation limit of the ferrimagnetic material coating for a time adequate to maintain a coherent oscillation of the magnetization in the ferrimagnetic material coating giving rise to an oscillation of the polarizing plane of the light beam, which is symmetrical with respect to said given plane, as well as a second stage comprising the following operations performed simultaneously: progressive reduction of the modulating field intensity, detection of any asymmetry of the oscillation of the polarizing plane of the light beam with respect to said given plane and induction along the light beam axis of a magnetic field corresponding to the detection performed and having the function reestablishing the symmetry of oscillation.

The invention also relates to a measuring system which performs the aforementioned process, comprising an emission device making it possible to emit a linearly polarized light beam propagating along a given propagation axis, a magnetic material plate aligned in accordance with the light beam and permitting, in its interior, a guided propagation of the beam, as well as a rotation of the beam polarization direction during its propagation, means for measuring the polarization rotation associated with the plate along the light beam axis, receiving the beam after passing through the associated plate and supplying a polarization rotation measurement signal wherein it also comprises a solenoid placed around the plate so as to be able to induce a magnetic field along the light beam axis, as well as supply and control circuits making it possible, during a time corresponding to the first stage, to supply said solenoid with a high amplitude alternating current so that the induced field saturates the plate and then during a time corresponding to the second stage to progressively reduce the alternating current supply level for the solenoid and simultaneously supply it with a feedback direct current as a function of the polarization rotation measurement signal supplied by the measuring means, to make it possible to offset a continuous magnetic field existing along the axis of the beam.

Finally, the invention relates to a measuring cell usable in connection with the aforementioned process and system. This cell more particularly comprises an elongated ferrimagnetic material coating arranged in such a way that the light beam passes through it in accordance with its small dimension, so that the demagnetizing field is perpendicular to the direction of the light beam.

BRIEF DESCRIPTION OF THE DRAWINGS

The invention is described in greater detail hereinafter relative to non-limitative embodiments and the attached drawings, wherein:

FIG. 3 shows an embodiment of the invention.

DETAILED DESCRIPTION OF THE PREFERRED EMBODIMENTS

Figure 1:
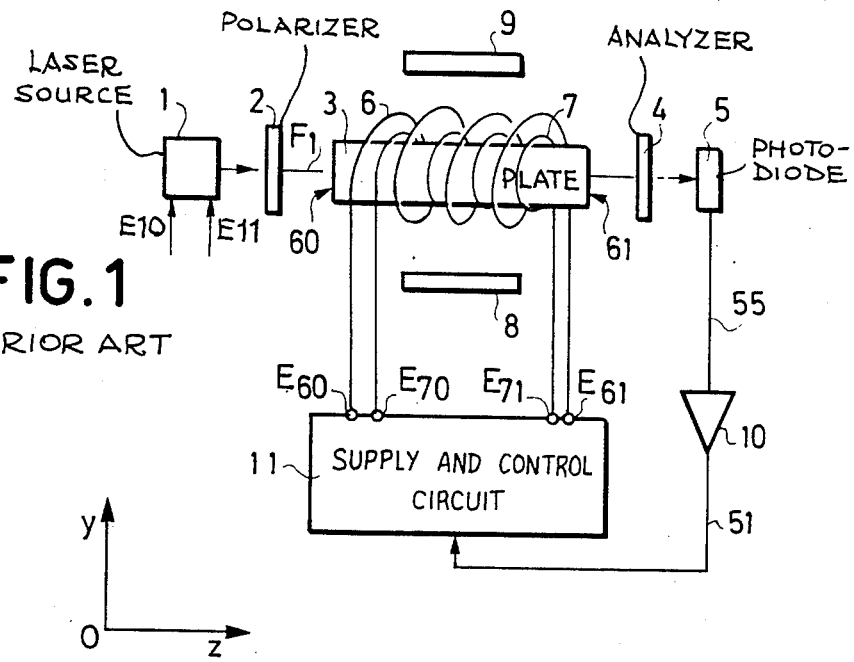
FIG. 1 shows a prior art magnetometer.

With reference to FIG. 1, a prior art magnetometer will be firstly described.

This magnetometer comprises a semiconductor laser source or laser diode 1, a polarizer 2, a plate 3, an analyzer 4 and a photodetector diode 5, the assembly being located in a plane yOz. Plate 3 is placed within a modulating coil 6 and a compensating coil 7, both of which are concentric. Two pole pieces 8, 9 located on either side of plate 3 induce a continuous magnetic field in plate 20 along the main plane of the plate and transverse to the light propagation direction in the plate. From one of its faces, laser diode 1 emits a collimated light beam F1. The typical dimensions of the emission face surface are 0.2 micron × 15 microns. Such a diode is supplied by a given voltage.

The plate 3 is cut from a gadolinium and gallium garnet, called GGG. On the latter, a relatively thick YIG coating is formed by a conventional epitaxy process, whose composition is essentially $Gd_{0.45}Y_{2.55}Ga_{0.9}Fe_{4.1}O_{12}$. The thickness obtained can be between 5 and 110 microns with a typical value being approximately 20 microns.

Such a YIG thickness makes it possible to propagate the light in a guided, but multimode manner and under these conditions the Faraday effect due to the magnetic field only appears in the form of a rotation of the light polarization plane and not as a conversion of the TM mode into the TE mode. This makes it possible to couple the light beam by the terminal faces of the YIG coating. In connection with the use of plate 3, consideration will be given hereinafter to the function of the YIG coating.

The operation of the magnetometer according to FIG. 1 will now be described. The laser diode 1 is supplied by its input terminals E10 and E11 with the aid of an appropriate, not shown source. The Zener diode supplies a light beam F1 having a power of a few milliwatts at a wavelength of 1.3 microns. After passing through polarizer 2, the beam F1 is coupled to plate 3 by the inlet face 60. Plate 3 acts as a waveguide. The magnetic field to be measured has the effect of inducing, in plate 3, a Faraday effect in the form of a rotation of the light polarization plane. This rotation is proportional to the intensity of the component of the magnetic field in the light propagation direction, i.e. axis Oz. It is therefore of interest to orient the complete measuring head shown in FIG. 1, in the magnetic field to be measured, in such a way that beam F1 is directed along the lines of the magnetic field to be measured.

Moreover, in order to obtain an optimum detection, it is necessary for the magnetization vector to be in the plane of the coating and in the absence of a magnetic field to be detected in the light propagation direction, it is normal thereto. The coating is saturated along this axis by means of pole pieces 8 and 9 or coils in a Helmholtz configuration. The value of this saturation magnetic field is less than 1 Oersted. The component of the magnetic field along the light propagation axis has the effect of disorienting this magnetization and of causing a rotation of the light polarization plane. The effects involved are not linear and make it difficult to directly measure the magnetic field.

As the rotation of the light polarization plane is not a linear function of the magnetic field to be measured along the propagation direction of beam F1 (Oz axis), it is difficult to translate the result of the measurement obtained at output 55 into a measured magnetic field value. Thus, use is made of a zero method. For this purpose, a supply and control circuit 11 supplies the exciting coil 6 with the aid of an alternating current by means of intake connections E60 and E61. Within plate 3, the coil 6 induces an alternating magnetic field parallel to the propagation direction of beam F1, i.e. along the axis Oz and consequently parallel to the field to be measured. The latter is modulated by an alternating field supplied by coil 6. The intensity of the light detected by the photodetector diode 5 is consequently modulated. In the absence of a magnetic field to be measured, the intensity of the light varies in accordance with a law only containing even harmonics of the exciting signal that are applied to the coil. The presence of a magnetic field to be measured along axis Oz gives rise to the appearance of odd harmonics of the exciting signal. The amplitude of the fundamental frequency detected varies as a function of the value of the field to be measured.

When the plate 3 is subject to a magnetic field to be measured, oriented in accordance with axis Oz, the photodetector diode 5 detects the light signal, transmits an electric signal in equivalent form on its output 55 to amplifier 10, which retransmits it on its output 51 to the supply and control circuit 11. The latter detects the odd harmonics produced and controls the direct current supply of the compensating coil 7 by way of the intake connections E70 and E71.

Within plate 3, coil 7 induces a continuous magnetic field in the direction of the light beam, in the direction of the field to be measured. By appropriately regulating the value of the direct current as regards direction and amplitude, so that the continuous field induced compensates the field to be measured, the latter no longer has any effect on the rotation of the polarization plane of light beam F1. It is then sufficient to measure the value of the direct current supplied to coil 7, in order to deduce therefrom the value of the measured field. Thus, the magnetometer according to FIG. 1 has made it possible to measure a magnetic field.

However, it is sometimes necessary to arrange several magnetometer measuring cells close to one another, in order to prepare a magnetism chart or card at a given point. The use of magnetometers of the type described hereinbefore suffers from the disadvantage that the pole pieces 8 and 9 of the different magnetometers would induce magnetic fields which would disturb the measurements of the other magnetometers.

Figure 2:
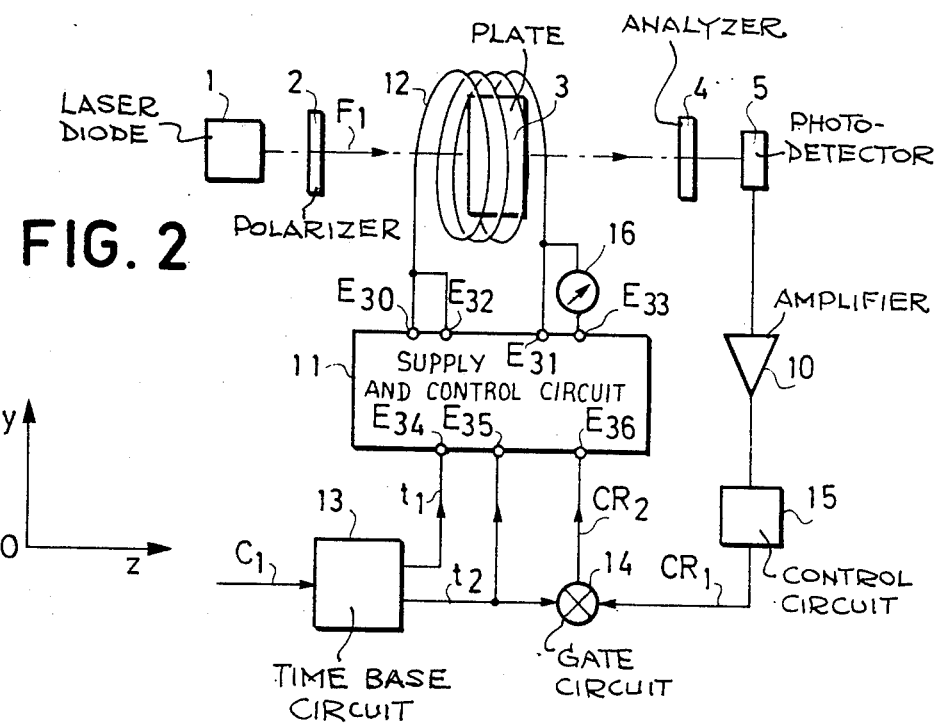
FIG. 2 shows a magnetometer according to the invention.

The invention supplies a measuring process and a magnetometer performing the same, which make it possible to obtain independence of the magnetic field produced by pole pieces 8 and 9. Moreover, the magnetometer according to the invention has the advantage of small size. FIG. 2 shows a magnetometer according to the invention. This magnetometer comprises a laser diode 1, a polarizer 2, a plate 3 constructed in the same way as that described relative to FIG. 1, an analyzer 4, a photodetector diode 5, a solenoid 12 along whose axis is placed plate 3 and control circuits 10, 11, 13, 14 and 15. As in the case of the magnetometer according to FIG. 1, the laser diode 1 emits a light beam F1, which is polarized by polarizer 2 and transmitted by solenoid 12 and analyzer 4 to the photodetector diode 5.

The process according to the invention provides for the induction, during a first time interval T1, of a modulating alternating magnetic field saturating the coating in the light propagation direction, which produces a coherent rotation of the magnetization. This oscillates about its axis of symmetry, which is perpendicular to the light propagation direction. The light polarization plane also oscillates in a symmetrical manner.

At the end of time T1, when the oscillation phenomenon is established in a stable manner, the process according to the invention provides for the progressive reduction of the amplitude of the modulating alternating magnetic field which is provided by the supply and control circuit 11. When the magnetic field drops below the saturation limit of plate 3, a continuous field to be measured, oriented in the light propagation direction is revealed by the asymmetry of the oscillation of the polarization plane. As the amplitude of the modulating alternating magnetic field is reduced, said asymmetry becomes even more noticeable.

Under these conditions and while reducing the amplitude of the modulating alternating magnetic field and as soon as an asymmetry is noticed in the oscillation of the polarization plane of beam F1, a feedback magnetic field is induced and this has the effect of offsetting the effect of the magnetic field to be measured. As the modulating magnetic field decreases, the system becomes more sensitive and it is possible to adjust the value of the feedback magnetic field to a value which accurately cancels out the effect of the field to be measured.

Thus, the magnetometer according to FIG. 2 functions as follows. A time base circuit 13 is put into operation under the control of a signal C1, which is either supplied manually, or by means of a device not shown. The time base circuit supplies a signal t1 of predetermined duration to input E34 of supply circuit 11. In response, the supply circuit 11 supplies on its outputs E30 and E31, an alternating current which supplies the solenoid 12. The amplitude of this alternating current is such that a modulating magnetic field is induced by the solenoid 12 in plate 3 which has the effect of saturating the latter. The time based circuit 13 acts as a simple timer to provide two signals t1 and t2, with t1 occurring for a predetermined period of time so as to provide to supply circuit 11, at signal terminal E34, a signal so that the control circuit 11 supplies at outputs E30 and E31 the alternating current to the solenoid 12. After this time T1 has expired the time base circuit disables the signal t1 and supplies the t2 signal which will be discussed below.

Thus, a light beam emitted by laser diode 1, polarized by polarizer 2 and passing through plate 3 has a polarization plane which oscillates under the effect of the modulating magnetic field. The diode 5 collects a light beam, whose brightness oscillates in a fixed regular manner.

At the end of time T1, the time base circuit 13 stops supplying the signal t1 and supplies a signal t2 to input E35 of supply circuit 11. The latter controls the regular reduction of the amplitude of the alternating current supplied on outputs E30 and E31 and consequently the modulating magnetic field. Signal t2 is also supplied to a gate circuit 14, so as to make this gate conductive.

If there is a slowly variable or continuous magnetic field present, or a component of such a magnetic field directed along the light beams propagation direction, when the modulating magnetic field decreases sufficiently, the photodetector diode 5 detects a signal having odd harmonics. This signal is amplified by the amplifier 10, which retransmits it to the detector 15. The detector 15 detects these odd harmonics in a conventional manner and supplies a control signal CR1 to the gate circuit 14. As the latter now conductive, as set forth above a control signal CR2 is applied to the input E36 of the supply circuit. Supply circuit 11 supplies between its outputs E32 and E33 a feedback current whose amplitude is a function of, this supplied control signal CR2. This current supplies the solenoid 12 and has the function of inducing a magnetic field, which offsets the effect of the detected magnetic field.

During this time, the alternating current supplied on outputs E30 and E31 by the supply circuit 11 continues to decrease. Thus, the sensitivity of the system increases and detector 15 can detect any odd harmonics corresponding to any weaker signals to be detected, bearing in mind the feedback current which is supplied to the solenoid. Thus, the process continues until the amplitude of the alternating current reaches a value corresponding to the sensitivity which is desired.

The value of the feedback current supplied to solenoid 12, in order to offset the magnetic field to be measured and is displayed on a measuring apparatus 16. This appropriately graduated apparatus supplies the value of the feedback magnetic field and consequently of the field to be measured. Thus, it should be noted that outputs E30 and E32 on the one hand and E31 and E33 on the other are disconnected or isolated by a means not shown.

The time T1 during which a high intensity modulation field is supplied is approximately 1 second. Moreover, in order to improve the operation of the magnetometer, the invention also gives plate 3 an elongated shape, so that the axis of the magnetization due to the demagnetizing field is perpendicular to the light propagation direction. The length and width of the plate are approximately in a ratio of 5 and the plate is located on the path of the light beam, in such a way that it is traversed in its width by the light beam F1. Under these conditions, when the demodulation field assumes a low value, the oscillation of said field preferably takes place in a symmetrical manner with respect to the direction of the demagnetization field, particularly in the absence of a field to be measured along the light beam propagation direction.

Moreover, the components of the magnetic fields perpendicular to the light axis will move a cooperative effect with the demagnetizing field in order to maintain the oscillation of the symmetrical magnetization. The coherence and symmetry of the oscillation are assured, so that it is merely necessary to reduce the amplitude of the modulation field to have the maximum sensitivity.

FIG. 3 is an isometric view of a magnetometer probe according to the invention. It is once again possible to see the laser diode 1, the plate 3, the analyzer 4, the photodetector diode 5 and the solenoid 12. Diode 1 is a semiconductor diode, which emits a polarized beam and for this reason there is no polarizer 2 as in FIG. 2. In this embodiment, plate 3 has a length of approximately 20 mm and a width of approximately 5 mm. The assembly is mounted in a generally cylindrical box 16 of diameter of approximately 30 mm and approximate length 45 mm.

The supply and control circuits 11, 13, 14, as well as the detection circuits 10, 15 are not shown in FIG. 3 for clarity. They can be connected to the magnetometer probe and particularly to diodes 1, 5 and to solenoid 12 by a connector 17 in the box 10 and a plug 18.

Thus, the construction of such a probe is particularly simple. Moreover, as a result of the structural simplicity, it is possible to easily envisage a very small probe.

What is claimed is:

1. An apparatus for measuring a magnetic field using a coating of a ferrimagnetic material into which is passed, in accordance with a given axis, a light beam polarized in accordance with a given plane, in such a way that a magnetic field oriented in accordance with the axis of the beam has a Faraday effect rotation of the light polarizing plane, wherein said apparatus comprises:

a first means for inducing in the ferrimagnetic material coating, along the axis of the light beam, an alternating modulation magnetic field, whose amplitude exceeds the saturation limit of the ferrimagnetic material coating for a first predetermined time adequate to maintain a coherent oscillation of the magnetization in the ferrimagnetic material coating giving rise to an oscillation of the polarizing plane of the light beam, which is symmetrical with respect to said given plane, a second means for simultaneously, progressively reducing in steps the modulating field intensity, the detection of any asymmetry of the oscillation of the polarizing plane of the light beam with respect to said given plane and induction along the light beam axis of a magnetic field corresponding to the detetion performed and for reestablishing the symmetry of oscillation.

2. An apparatus according to claim 1, further comprising:

an emission device making it possible to emit a linearly polarized light beam propagating along a given propagation axis, said ferrimagnetic material plate aligned in accordance with the light beam and permitting, in its interior, a guided propagation of the beam, as well as a rotation of the beam polarization direction during its propagation, means for measuring the polarization rotation associated with the plate along the light beam axis, receiving the beam after pasing through the associated plate and supplying a polarization rotation measurement signal;

a solenoid placed around the ferrimagnetic material so as to be able to induce a magnetic field along the light beam axis, and wherein said first and second means comprise supply and control circuits making it possible, during a time corresponding to said first predetermined time period to supply said solenoid with a high amplitude alternating current so that the induced field saturates the plate and then during said second time corresponding to the second stage to progressively reduce the alternating current supply level for the solenoid and simultaneously supply it with a feedback direct current as a function of the polarization rotation measurement signal supplied by the measuring means, to make it possible to offset a continuous magnetic field existing along the axis of the beam.

3. An apparatus according to claim 2, wherein said supply and control circuits comprise:

a supply circuit having first, second and third control inputs and multiple outputs for supplying current to said solenoid in accordance with the signals received on said supply circuits three inputs, a gate circuit connected to the third input of hte supply circuit for transmitting thereto a polarization rotation measurement signal received from measuring means, a time base circuit connected to the first and second inputs of the supply circuit, as well as to the gate circuit which supplies for a predetermined time corresponding said first predetermined time a first signal to the first input of the supply circuit in order to control the supply of the solenoid with the aid of a high amplitude modulating alternating current and then for a time corresponding to the second time a second signal to the second input of the supply circuit and also for producing a signal which controls the progressive reduction of the modulating alternating current and which further supplies this signal to said gate circuit so as to make said gate circuit conductive, while permitting the transmission of the polarization rotation measurement signal to the third input of the supply circuit, such that the the third input controls the supply of the solenoid with the aid of a feedback current inducing a magnetic field, which cancels out the effect of the magnetic field to be measured.

4. A measuring cell according to claim 1, wherein the ferrimagnetic material coating has an elongated shape and is deposited in such a way that the light beam passes through it along its small dimensions.

* * * * *